United States Patent
Watanabe et al.

(10) Patent No.: US 11,177,423 B2
(45) Date of Patent: Nov. 16, 2021

(54) LIGHT EMITTING DEVICE

(71) Applicants: CITIZEN ELECTRONICS CO., LTD., Fukiyoshida (JP); CITIZEN WATCH CO., LTD., Nishitokyo (JP)

(72) Inventors: Masahiro Watanabe, Yamanashi (JP); Masahide Watanabe, Fujiyoshida (JP)

(73) Assignees: CITIZEN ELECTRONICS CO., LTD., Fujiyoshida (JP); CITIZEN WATCH CO., LTD., Nishitokyo (JP)

( * ) Notice: Subject to any disclaimer, the term of this patent is extended or adjusted under 35 U.S.C. 154(b) by 24 days.

(21) Appl. No.: 16/615,095

(22) PCT Filed: May 17, 2018

(86) PCT No.: PCT/JP2018/019170
§ 371 (c)(1),
(2) Date: Nov. 19, 2019

(87) PCT Pub. No.: WO2018/212300
PCT Pub. Date: Nov. 22, 2018

(65) Prior Publication Data
US 2020/0212273 A1   Jul. 2, 2020

(30) Foreign Application Priority Data
May 19, 2017   (JP) .............................. JP2017-099965

(51) Int. Cl.
*H01L 33/56*   (2010.01)
*H01L 33/48*   (2010.01)

(52) U.S. Cl.
CPC ............ *H01L 33/56* (2013.01); *H01L 33/486* (2013.01)

(58) Field of Classification Search
CPC ............................... H01L 33/56; H01L 33/486
See application file for complete search history.

(56) References Cited

U.S. PATENT DOCUMENTS

2005/0117361 A1   6/2005   Takeda et al.
2009/0256166 A1   10/2009   Koike et al.
(Continued)

FOREIGN PATENT DOCUMENTS

JP   2005123165 A   5/2005
JP   2010283244 A   12/2010
(Continued)

OTHER PUBLICATIONS

International Search Report and Written Opinion for related PCT App No. PCT/JP2018/019170, dated Jun. 19, 2018, 14 pgs.
(Continued)

*Primary Examiner* — Jay C Chang
*Assistant Examiner* — Mikka Liu
(74) *Attorney, Agent, or Firm* — Procopio, Cory, Hargreaves & Savitch LLP (57) ABSTRACT

Provided is a light-emitting device wherein short-wavelength light included in emitted white light is attenuated with a small increase in manufacturing cost and a small decrease in luminous flux. The light-emitting device includes a mount board, LED elements mounted on the mount board and emitting first light which is blue light or has a shorter wavelength than blue light, and a sealing resin containing phosphor particles and titanium-dioxide particles and filled on the mount board to integrally seal the LED elements, the phosphor particles being excited by the first light to emit second light. The first light and the second light are mixed and emitted as white light, and transmitting through the sealing resin causes the first light to be attenuated more than the second light by the titanium-dioxide particles.

7 Claims, 6 Drawing Sheets

(56) References Cited

U.S. PATENT DOCUMENTS

| | | | |
|---|---|---|---|
| 2011/0006668 A1* | 1/2011 | Hussell | H01L 33/501 |
| | | | 313/499 |
| 2013/0120967 A1* | 5/2013 | Liao | H01L 33/486 |
| | | | 362/97.1 |
| 2015/0263245 A1* | 9/2015 | Akagawa | H01L 33/502 |
| | | | 257/88 |
| 2016/0093779 A1 | 3/2016 | Maeno et al. | |
| 2016/0260873 A1* | 9/2016 | Yamada | H01L 33/502 |
| 2017/0045201 A1 | 2/2017 | Jones | |
| 2018/0062058 A1 | 3/2018 | Abe et al. | |
| 2018/0069162 A1* | 3/2018 | Abe | H01L 33/56 |

FOREIGN PATENT DOCUMENTS

| | | | |
|---|---|---|---|
| JP | 2015188075 A | 10/2015 | |
| JP | 2016054176 A | 4/2016 | |
| JP | 2016066742 A | 4/2016 | |
| JP | 2017059754 A | 3/2017 | |
| JP | 2018032692 A | 3/2018 | |
| WO | 2007018039 A1 | 2/2007 | |

OTHER PUBLICATIONS

International Preliminary Report on Patentability for related PCT App No. PCT/JP2018/019170, dated Nov. 19, 2019, 11 pgs.

\* cited by examiner

LIGHT EMITTING DEVICE

CROSS-REFERENCE TO RELATED APPLICATIONS

This application is a U.S. National Stage entry of PCT Application No: PCT/JP2018/019170 filed May 17, 2018, which claims priority to Japanese Patent Application No. 2017-099965, filed May 19, 2017, the contents of which are incorporated herein by reference.

FIELD

The present invention relates to a light-emitting device.

BACKGROUND

Chip-on-board (COB) light-emitting devices are known in which light-emitting elements, such as light-emitting diode (LED) elements, are mounted on a conventional substrate, such as a ceramic or metal board. Such a light-emitting device includes a phosphor-containing translucent or transparent resin sealing the LED elements, and mixes light emitted from the LED elements with light generated by exciting the phosphor with the emitted light, thereby producing white light, for example. Light-emitting devices emitting white light are widely used as light sources for various kinds of lighting equipment.

Further, light-emitting devices are known which remove light in a desired wavelength range from emitted light with filters. For example, Patent Literature 1 describes a light-emitting device (vehicular lamp) including light-emitting diodes (LEDs) for generating blue light, a long-wavelength phosphor for generating light having a peak wavelength substantially the same as or longer than the wavelength of amber in response to the blue light generated by the LEDs, and an optical filter for substantially cutting off the light generated by the LEDs and for substantially transmitting light in a wavelength range around the peak wavelength out of the light generated by the long-wavelength phosphor to produce amber light based on the light generated by the LEDs and long-wavelength phosphor.

CITATION LIST

Patent Literature

Patent Literature 1: Japanese Unexamined Patent Publication No. 2005-123165

SUMMARY

For example, sea turtles have the habit of being attracted by short-wavelength light in the wavelength range of 560 nm or less. Thus, if a light-emitting device whose emission wavelength range includes a wavelength of 560 nm or less is used in a habitat of sea turtles as the light source of outside lighting equipment, such as a streetlight, they draw near the streetlight and cannot go back to the sea, resulting in their death. A law for preserving sea turtles is in force in the State of Florida, for example, where light-emitting devices whose emission wavelength range includes a wavelength of 560 nm or less cannot be used for a streetlight; it is therefore required to develop light-emitting devices which do not emit light in the wavelength range of 560 nm or less.

Although the above problem of sea turtles is merely an example, it is often desired to remove light in a specific wavelength range, according to the use of the light-emitting device. One possible way to achieve such an objective is to use an optical filter, as in the invention of Patent Literature 1. However, use of a filter may attenuate light in a required wavelength range, and also increase the manufacturing cost of light-emitting devices.

It is an object of the present invention to provide a light-emitting device wherein short-wavelength light included in emitted white light is attenuated with a small increase in manufacturing cost and a small decrease in luminous flux.

Provided is a light-emitting device including a mount board, LED elements mounted on the mount board and emitting first light which is blue light or has a shorter wavelength than blue light, and a sealing resin containing phosphor particles and titanium-dioxide particles and filled on the mount board to integrally seal the LED elements, the phosphor particles being excited by the first light to emit second light. The first light and the second light are mixed and emitted as white light, and transmitting through the sealing resin causes the first light to be attenuated more than the second light by the titanium-dioxide particles.

Preferably, in the light-emitting device, the intensity ratio of light 560 nm or less in wavelength to all the emitted white light is less than 10%.

Preferably, in the light-emitting device, the titanium-dioxide particles are dispersed in the sealing resin, and the sealing resin contains the phosphor particles so that their concentration increases toward the mount board.

Preferably, in the light-emitting device, the sealing resin further contains a filler having an average particle size of 1 to 100 μm and a nanoscale filler having an average particle size of 1 to 100 nm, and the sealing resin includes a deposition layer of the phosphor particles through which the first light emitted from the LED elements transmits, the deposition layer covering upper and side surfaces of the LED elements and areas obliquely above the LED elements.

Preferably, in the light-emitting device, the sealing resin includes a resin layer on a side further from the mount board, the resin layer containing the titanium-dioxide particles at a higher concentration than a side of the sealing resin closer to the mount board.

Preferably, in the light-emitting device, the sealing resin contains the titanium-dioxide particles at a concentration of 1% to 3%.

According to the light-emitting device, short-wavelength light included in emitted white light can be attenuated with a small increase in manufacturing cost and a small decrease in luminous flux.

DESCRIPTION OF EMBODIMENTS

Hereinafter, with reference to the accompanying drawings, light-emitting devices will be explained in detail. However, note that the present invention is not limited to the drawings or the embodiments described below.

Figure 1:
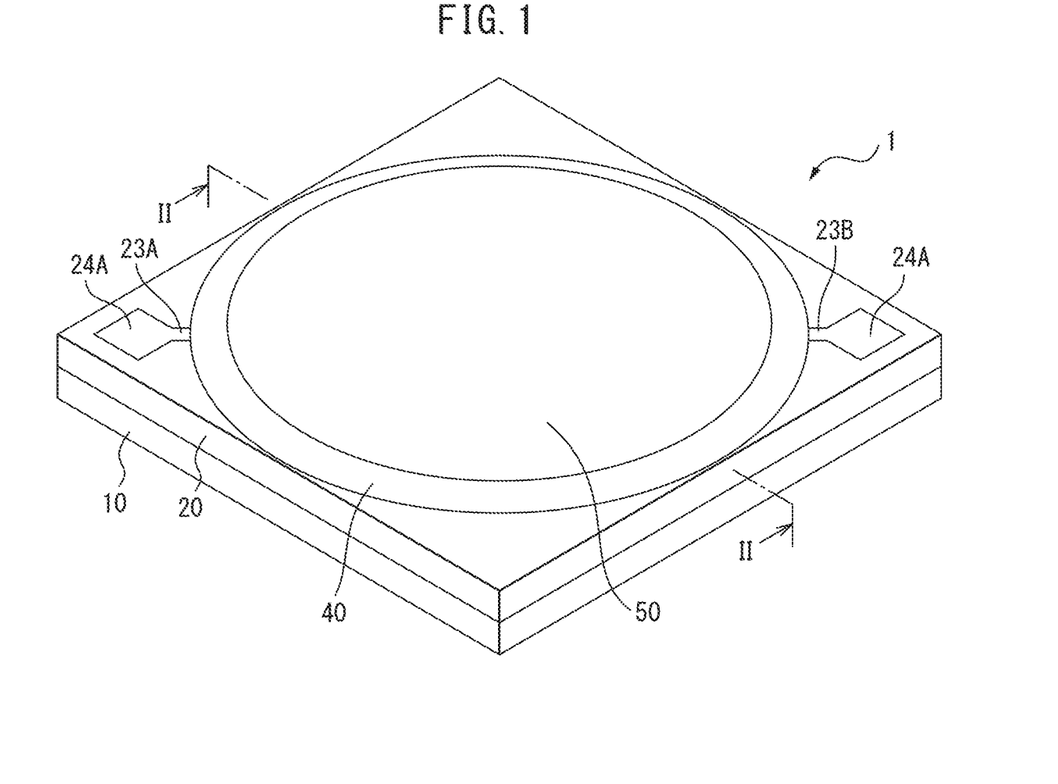
FIG. 1 is a perspective view of a light-emitting device 1.
Figure 2:
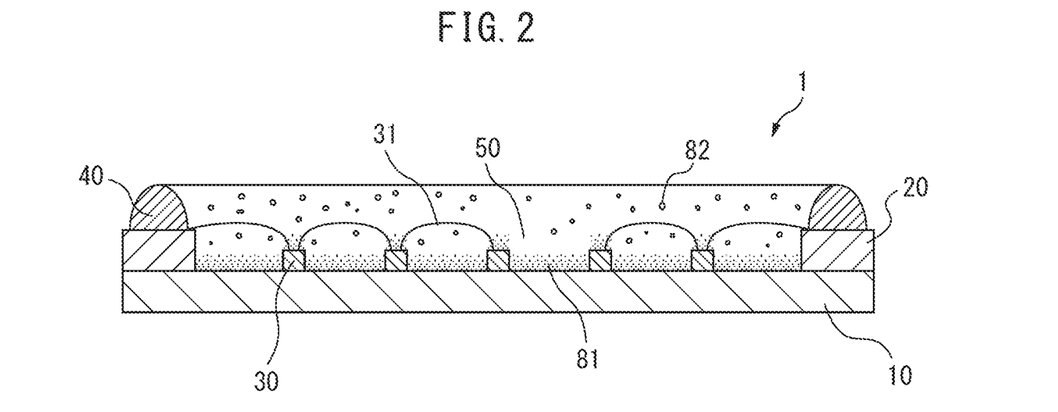
FIG. 2 is a cross-sectional view of the light-emitting device 1 taken along line II-II in FIG. 1.

FIG. 1 is a perspective view of a light-emitting device 1. FIG. 2 is a cross-sectional view of the light-emitting device 1 taken along line II-II in FIG. 1. The light-emitting device 1 is a COB-type LED package including LED elements as light-emitting elements, and is used as an LED light source for various kinds of lighting equipment, for example. Major components of the light-emitting device 1 include a mount board 10, a circuit board 20, LED elements 30, a resin frame 40 and a sealing resin 50.

The mount board 10 is a square metal board, for example, including, in the center of its upper surface, a circular mounting region 11 (see FIG. 3 described later) on which the LED elements 30 are mounted. The mount board 10 is made of, for example, aluminum excellent in heat resistance and heat dissipation, since it also functions as a heat-sinking substrate which causes heat generated by the LED elements 30 and phosphor particles described later to be discharged outside the device. However, the mount board 10 may be made of another metal, such as copper, as long as it excels in heat resistance and heat dissipation.

Figure 3:
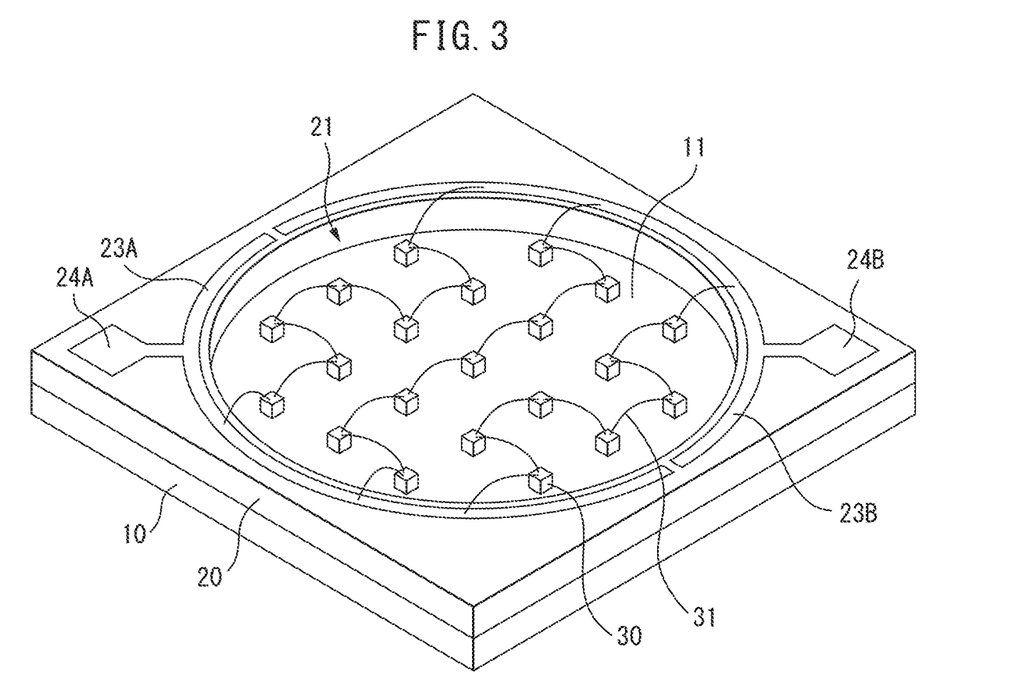
FIG. 3 is a perspective view showing conductive patterns on the circuit board 20 and arrangement of the LED elements 30.

FIG. 3 is a perspective view showing conductive patterns on the circuit board 20 and arrangement of the LED elements 30. The circuit board 20 has a square shape of the same size as the mount board 10, for example, and includes a circular opening 21 in the center. The circuit board 20 has a lower surface bonded to the mount board 10 with an adhesive sheet. In the illustrated example, arc-shaped conductive patterns 23A, 23B are formed on one and the other sides of the upper surface of the circuit board 20, respectively, so as to surround the opening 21. Connecting electrodes 24A, 24B are formed at one and the other corners located diagonally on the upper surface of the circuit board 20, respectively. One and the other of the connecting electrodes 24A, 24B serve as anode and cathode electrodes, respectively. Connecting these electrodes to an external power source and applying a voltage thereacross causes the light-emitting device 1 to emit light.

The LED elements 30 are an example of the light-emitting elements, and made of a gallium nitride compound semiconductor which emits light at a wavelength in the ultraviolet to blue regions, for example. Hereinafter, the LED elements 30 are assumed to be blue LEDs emitting blue light (first light) in the wavelength range of about 450 to 460 nm, for example. However, the LED elements 30 may emit light having a shorter wavelength than blue light, such as violet or ultraviolet light. In the light-emitting device 1, the LED elements 30 are mounted in a lattice pattern on the circular mounting region 11 of the mount board 10 exposed in the opening 21 of the circuit board 20. FIG. 3 shows an example where twenty-one LED elements 30 are mounted. The lower surfaces of the LED elements 30 are fixed on the upper surface of the mount board 10 with an insulating transparent adhesive, for example.

Each LED element 30 includes a pair of element electrodes on its upper surface. As shown in FIG. 3, the element electrodes of adjacent LED elements 30 are electrically connected to each other by bonding wires 31 (hereinafter, simply referred to as wires 31). The wires 31 extending from the LED elements 30 located at the edge of the opening 21 are connected to the conductive pattern 23a or 23b of the circuit board 20. Accordingly, the LED elements 30 are supplied with a current through the wires 31.

The resin frame 40 is a circular white resin frame, for example, matching the size of the opening 21 of the circuit board 20, and is fixed on the upper surface of the circuit board 20 so as to overlap the conductive patterns 23a, 23b fringing the opening 21. The resin frame 40 is a dam member preventing the sealing resin 50 from flowing out, and causes light emitted laterally from the LED elements 30 to reflect toward the upper side of the light-emitting device 1 (opposite to the mount board 10 as seen from the LED elements 30).

The sealing resin 50 fills the space on the mount board 10 enclosed by the resin frame 40 up to a height higher than the topmost parts of the wires 31, as shown in FIG. 2, and integrally covers and protects (seals) the LED elements 30 and wires 31. The sealing resin 50 is a colorless and transparent resin, such as an epoxy or silicone resin, and contains phosphor particles 81 and $TiO_2$ (titanium-dioxide) particles 82.

The phosphor particles 81 are particles of a yellow phosphor, such as yttrium aluminum garnet (YAG), and deposited in the sealing resin 50. In other words, the sealing resin 50 contains the phosphor particles 81 so that its concentration increases from the upper to lower ends of the sealing resin 50, which are opposite to and closer to the mount board 10, respectively. FIG. 2 shows the deposition of the phosphor particles 81 in the sealing resin 50 by a pattern of light and shade. As shown in FIG. 2, the phosphor particles 81 are actually deposited not only on the upper surface of the mount board 10 but also on the upper surfaces of the LED elements 30.

The light-emitting device 1 mixes blue light emitted from the LED elements 30 and yellow light (second light) generated by exciting the phosphor particles 81 in the sealing resin 50 with the blue light, thereby emitting white light. In the light-emitting device 1, the LED elements 30 are mounted directly on the mount board 10 having high heat dissipation, while the phosphor particles 81 in the sealing resin 50 are deposited near the mount board 10; accordingly, heat generated by the LED elements 30 and phosphor particles 81 is easily released outside the device. Since this prevents the decrease in emission intensity of the LED elements 30 caused by heat, it is advantageous for improving the emission intensity.

As the phosphor particles 81, the sealing resin 50 may contain particles of multiple phosphors, such as green and red phosphors. In this case, the light-emitting device 1 mixes blue light emitted from the blue LED elements 30 and green and red light (second light) generated by exciting the green and red phosphors with the blue light, thereby emitting white light. The green phosphor is a particulate phosphor material, such as $(BaSr)_2SiO_4:Eu^{2+}$, which absorbs the blue light emitted from the LED elements 30 and wavelength-converts it into green light. The red phosphor is a particulate phosphor material, such as $CaAlSiN_3:Eu^{2+}$, which absorbs the blue light emitted from the LED elements 30 and wavelength-converts it into red light.

Alternatively, as the phosphor particles 81, the sealing resin 50 may further contain a yellow phosphor, for example, in addition to the green and red phosphors, or contain phosphors different from the above combination, such as a combination of yellow and red phosphors. If the sealing resin 50 contains particles of multiple phosphors, the phosphor particles 81 may be deposited in layers of different phosphors, depending on the differences between their particle sizes, specific gravities or other properties.

The $TiO_2$ particles 82 are contained in order to attenuate short-wavelength light (mainly blue light) included in the white light emitted from the light-emitting device 1, and are uniformly dispersed in the sealing resin 50, for example. In other words, in the light-emitting device 1, the $TiO_2$ particles 82 exist beside and above the LED elements 30 sealed in the sealing resin 50. The blue light emitted from the LED elements 30 is scattered or absorbed by the $TiO_2$ particles 82 and thereby attenuated, when it transmits through the sealing resin 50. The $TiO_2$ particles 82 cause the surface of the sealing resin 50 to appear white.

Figure 4:
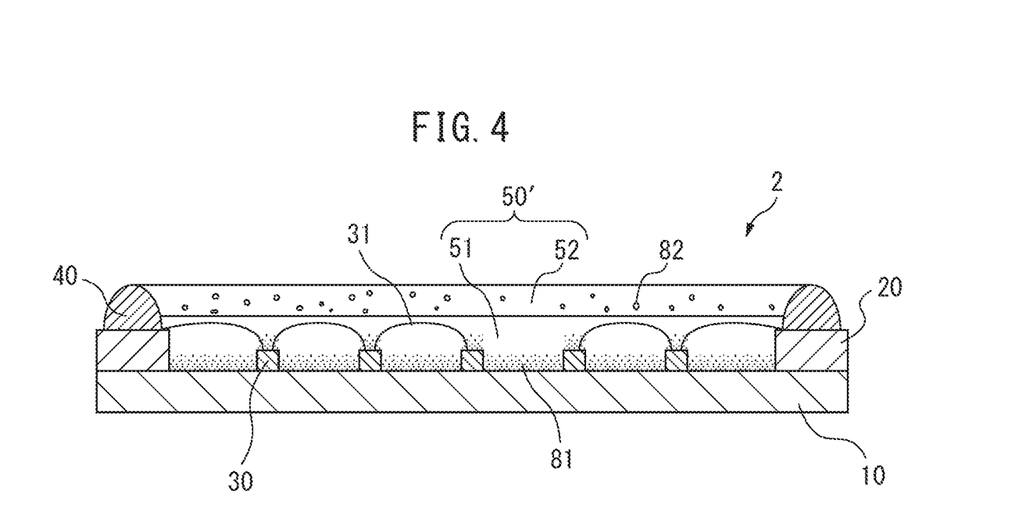
FIG. 4 is a cross-sectional view of a light-emitting device 2.

FIG. 4 is a cross-sectional view of a light-emitting device 2. The light-emitting device 2 is identical in structure to the light-emitting device 1, except for the sealing resin. Thus, the following describes the light-emitting device 2 by focusing on differences from the light-emitting device 1, and descriptions already given will not be repeated.

The sealing resin 50' of the light-emitting device 2 is an epoxy or silicone resin, for example, and integrally seals the LED elements 30 and wires 31, similarly to the sealing resin 50 of the light-emitting device 1, but includes two layers, i.e., a phosphor layer 51 and a $TiO_2$ layer 52, unlike the sealing resin 50. The phosphor layer 51 is disposed on the side facing the mount board 10, and contains the phosphor particles 81 so that its concentration increases from the upper to lower ends of the phosphor layer 51, which are opposite to and closer to the mount board 10, respectively, similarly to the sealing resin 50 of the light-emitting device 1.

The $TiO_2$ layer 52 is disposed above the phosphor layer 51 in the sealing resin 50' (at the upper end in the sealing resin 50'), and contains the $TiO_2$ particles 82 at a uniform concentration. The $TiO_2$ layer 52 is formed, for example, by filling a resin containing the $TiO_2$ particles 82 up to the upper end of the resin frame 40 after the phosphor layer 51 is formed by filling a resin containing the phosphor particles 81 up to a height between the upper and lower ends of the resin frame 40. The sealing resin 50' of the light-emitting device 2 thereby includes a resin layer on a side further from the mount board 10, the resin layer containing the $TiO_2$ particles 82 at a higher concentration than a side of the sealing resin 50' closer to the mount board 10.

In the light-emitting device 2 also, the blue light emitted from the LED elements 30 is scattered or absorbed by the $TiO_2$ particles 82 in the $TiO_2$ layer 52 and thereby attenuated, when it transmits through the sealing resin 50 and is emitted outside the device. As in the light-emitting device 2, the $TiO_2$ particles 82 need not be uniformly dispersed in the whole sealing resin; it is sufficient for the blue light from the LED elements 30 to transmit through a resin layer containing the $TiO_2$ particles 82 when it is emitted outside the device.

Figure 5:
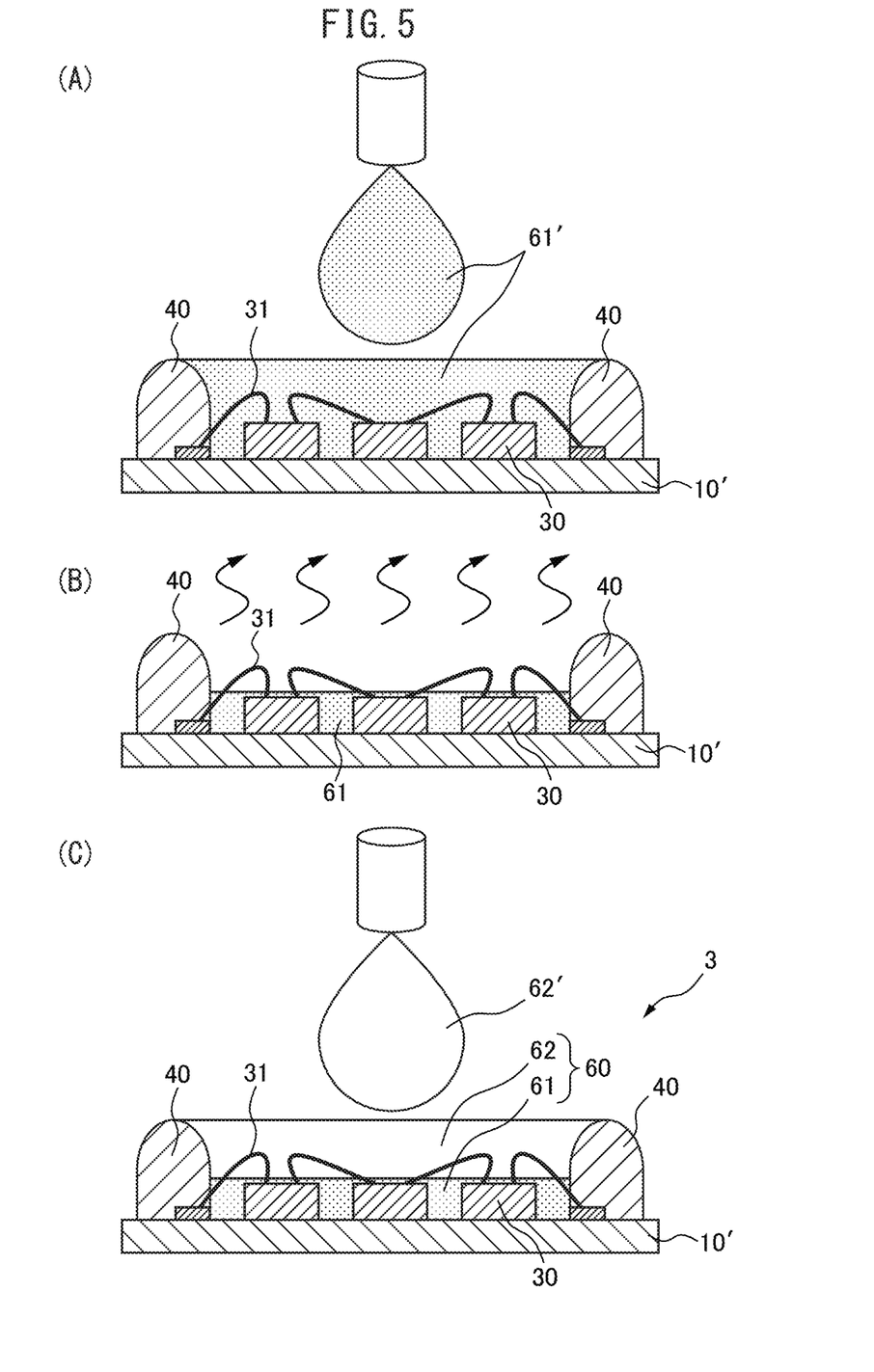
FIGS. 5(A) to 5(C) are cross-sectional views for explaining a light-emitting device 3 and a method for manufacturing the same.

FIGS. 5(A) to 5(C) are cross-sectional views for explaining a light-emitting device 3 and a method for manufacturing the same. FIGS. 5(A) and 5(B) show manufacturing processes of the sealing resin of the light-emitting device 3, while FIG. 5(C) shows the finished light-emitting device 3. The light-emitting device 3 is identical in structure to the light-emitting device 1, except for the substrate and sealing resin. Thus, the following describes the light-emitting device 3 by focusing on differences from the light-emitting device 1, and descriptions already given will not be repeated.

The substrate of the light-emitting device 3 is not a combination of the mount board 10 and circuit board 20, but a single ceramic substrate 10'. The ceramic substrate 10' is a flat substrate on which the LED elements 30 are mounted and patterns similar to the conductive patterns 23A, 23B and connecting electrodes 24A, 24B are formed, and has the functions of the mount board and circuit board. Such a single flat substrate may be used for a light-emitting device.

The sealing resin 60 of the light-emitting device 3 is an epoxy or silicone resin, for example, and integrally seals the LED elements 30 and wires 31, similarly to the sealing resin 50 of the light-emitting device 1, but includes two layers, i.e., a phosphor layer 61 and a resin layer 62, unlike the sealing resin 50.

As shown in FIG. 5(C), the phosphor layer 61 fills the space on the mounting region 11 up to a height higher than the upper surfaces of the LED elements 30 and lower than the topmost parts of the wires 31. The upper surface of the phosphor layer 61 may be higher than the topmost parts of the wires 31, but is preferably just above the upper surface of the LED elements 30 as in the illustrated example, since it is preferred that the phosphor particles be placed near the ceramic substrate 10' in terms of heat dissipation. The phosphor layer 61 contains the phosphor particles and $TiO_2$ particles, which are uniformly dispersed regardless of positions in the horizontal and vertical directions without being separated in layers in the phosphor layer 61 even if it includes multiple phosphors.

The resin layer 62 is a transparent resin layer disposed above the phosphor layer 61 in the sealing resin 60 (at the upper end in the sealing resin 60), and contains neither the phosphor particles nor $TiO_2$ particles. However, the resin layer 62 may contain the $TiO_2$ particles, and contain phosphor particles at a lower concentration than the phosphor layer 61 if necessary. The resin of the resin layer 62 may be different from that of the phosphor layer 61, and need not be completely transparent.

In order to form the sealing resin 60, as shown in FIG. 5(A), a mixture 61' of an uncured epoxy or silicone resin, phosphor particles, $TiO_2$ particles and an organic solvent is first filled into the space on the ceramic substrate 10' enclosed by the resin frame 40. Of these, the organic solvent is a solvent, such as isobutyl acetate, volatilizing at a temperature where the resin is not cured. Subsequently, as shown in FIG. 5(B), the mixture 61' is heated at a temperature where the resin in the mixture 61' is not cured, thereby volatilizing the organic solvent. This causes the volume of the mixture 61' to reduce, thereby producing the phosphor layer 61 having a lower height than the unheated mixture 61'. Further, the phosphor layer 61 is heated at a higher temperature than when the organic solvent is volatilized, thereby curing the phosphor layer 61. Thereafter, as shown in FIG. 5(C), a transparent resin 62' is filled on the phosphor layer 61 up to the upper end of the resin frame 40. In this way, the light-emitting device 3 shown in FIG. 5(C) is completed.

In the light-emitting device 3 also, the blue light emitted from the LED elements 30 is scattered or absorbed by the $TiO_2$ particles in the phosphor layer 61 and thereby attenuated, when it transmits through the sealing resin 50 and is emitted outside the device. Since forming and curing the phosphor layer 61 prior to the natural deposition of the phosphor particles and $TiO_2$ particles allows for keeping these particles uniformly dispersed in the phosphor layer 61, the occurrence of variations in degree of dispersion is reduced.

FIGS. 6(A) to 6(C) show emission spectra of the light-emitting device 1. These figures show results of measurement in which a silicone resin, a yellow phosphor and three commercially available titanium-dioxide powders are used as the sealing resin 50, phosphor particles 81 and $TiO_2$ particles 82, respectively. More specifically, as for FIGS. 6(A), 6(B) and 6(C), powders whose titanium-dioxide content and average particle size are 90% and 0.25 μm, 90% and 0.28 μm, and 93% and 0.21 μm are used as the $TiO_2$ particles 82, respectively. Each figure shows the results of measurement obtained by changing the weight-percentage concentration (added amount) of the $TiO_2$ particles 82 in the sealing resin 50 in three levels of 0% (i.e., the $TiO_2$ particles 82 are not added), 1% and 3%, in a superposed manner.

The abscissa and ordinate of each figure represent wavelength (nm) and relative intensity (%) with respect to the peak around 600 nm measured when the concentration of the $TiO_2$ particles 82 is 0%. The peaks around 450 nm and 600 nm in each figure correspond to the blue light emitted by the LED elements 30 and the yellow light generated by the yellow phosphor, respectively.

In either case of FIGS. 6(A) to 6(C), the emission intensity generally decreases as the concentration of the $TiO_2$ particles 82 increases; however, the amount of decrease is relatively small in the wavelength range of 600 nm or more, and relatively large in the wavelength range of 560 nm or less. When the concentration of the $TiO_2$ particles 82 is 1% or 3%, the 450-nm peak is more attenuated than the 600-nm peak. When the concentration is 0%, the intensity ratio (residual rate of 560-nm or shorter wavelengths) of light 560 nm or less in wavelength to all the light emitted from the light-emitting device 1 is 21.5% in either case of FIGS. 6(A) to 6(C). In contrast, when the concentration is 3%, the intensity ratios in the cases of FIGS. 6(A) to 6(C) are 9.2%, 8.9% and 6.9%, respectively.

In other words, regardless of the kinds of titanium-dioxide powders, the blue light is more attenuated than the yellow light by transmitting through the sealing resin 50, and the intensity ratio of light 560 nm or less in wavelength to all the light emitted from the light-emitting device 1 is less than 10%. Accordingly, mixing the $TiO_2$ particles 82 with the sealing resin 50 at a concentration of 1% or more allows for attenuating short-wavelength light of 560 nm or less without substantially decreasing the emission intensity in the wavelength range of 600 nm or more.

However, as the concentration of the $TiO_2$ particles 82 increases, the light emitted from the light-emitting device 1 decreases in intensity and becomes darker. When the concentration is 0%, the total luminous flux of the light-emitting device 1 is 443.7 lm in either case of FIGS. 6(A) to 6(C). In contrast, the fluxes in the cases of FIGS. 6(A) to 6(C) are 347.8 lm, 350.9 lm and 289.1 lm at a concentration of 3%, and 204.4 lm, 219.3 lm and 175.3 lm at a concentration of 6%, respectively. In other words, when the concentration of the $TiO_2$ particles 82 is up to 3%, the total luminous flux is about 70% as compared to when the $TiO_2$ particles 82 are not added; in contrast, when the concentration is 6%, the total luminous flux decreases to 50% or less. Accordingly, the weight-percentage concentration of the $TiO_2$ particles 82 in the sealing resin 50 is preferably 3% or less.

Taking both the attenuation of short-wavelength light and the decrease in total luminous flux into consideration, the weight-percentage concentration of the $TiO_2$ particles 82 in the sealing resin 50 is preferably in the range from 1% to 3%. The average particle sizes and percentage contents of the $TiO_2$ particles 82 in the titanium-dioxide powders, the residual rates of 560-nm or shorter wavelengths, and the total luminous fluxes of the light-emitting device 1 are summarized below for FIGS. 6(A) to 6(C). The values 0%, 3% and 6% in the table are the concentrations of the $TiO_2$ particles 82 in the sealing resin 50.

TABLE 1

Figure 6:
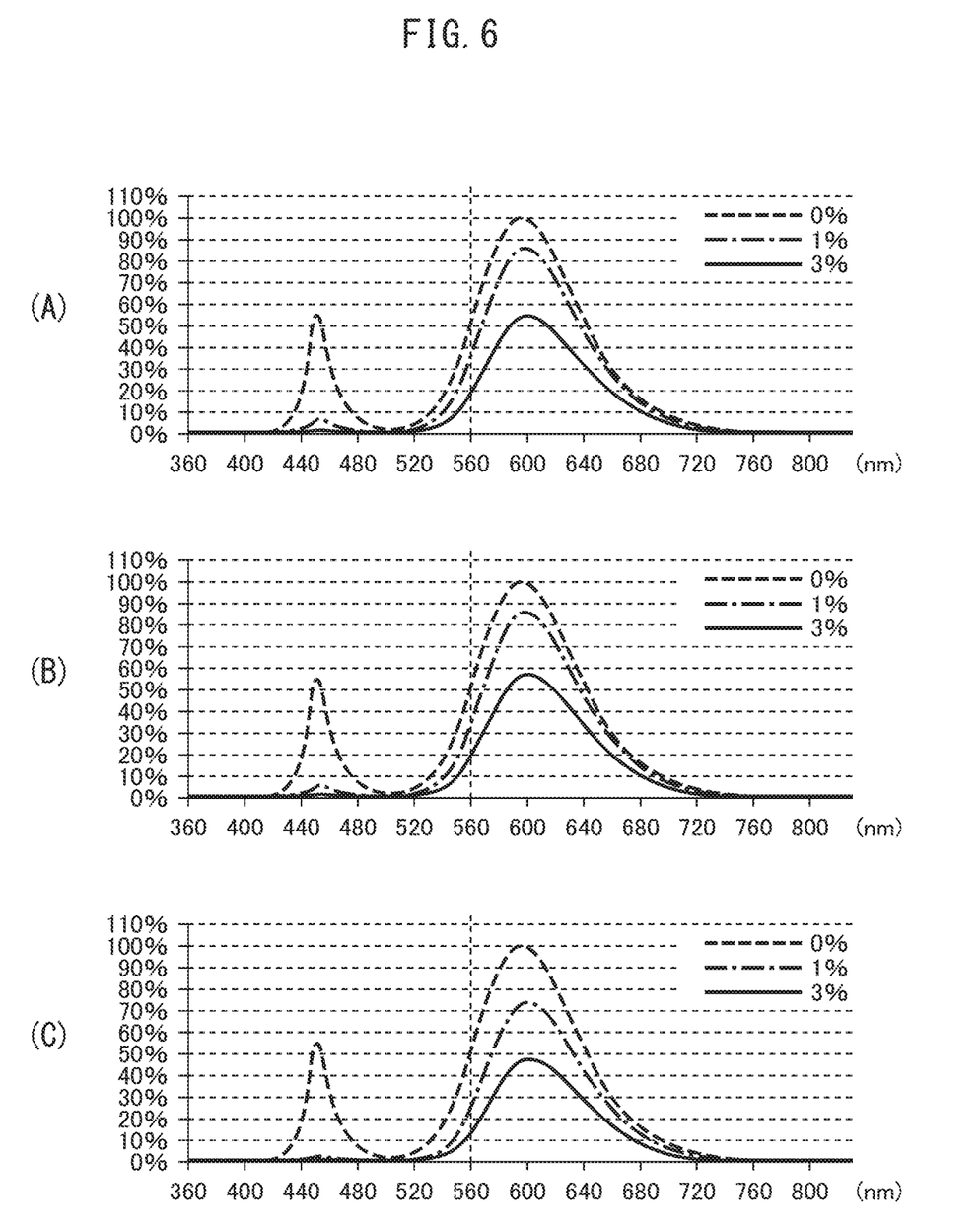
FIGS. 6(A) to 6(C) show emission spectra of the light-emitting device 1.

| FIG. 6 | $TiO_2$ particles | | residual rate of 560-nm or shorter wavelengths | | | total luminous flux (lm) | | |
| --- | --- | --- | --- | --- | --- | --- | --- | --- |
| | content | average particle size | 0% | 3% | 6% | 0% | 3% | 6% |
| (A) | 90% | 0.25 μm | 21.5% | 9.2% | 5.2% | 443.7 | 347.8 | 204.4 |
| (B) | 90% | 0.28 μm | 21.5% | 8.9% | 5.6% | 443.7 | 350.9 | 219.3 |
| (C) | 93% | 0.21 μm | 21.5% | 6.9% | 4.5% | 443.7 | 289.1 | 175.3 |

In manufacturing the light-emitting devices 1, 2, the phosphor particles 81 are completely deposited in the sealing resin 50 or 50', and then the sealing resin is cured; thus, the phosphor particles 81 are disposed immediately above the mount board 10. However, as will be described below, addition of an appropriate filler and nanoscale filler (nanofiller) to the sealing resin leads to a "semi-deposition state" which is an intermediate state between dispersion and deposition of the phosphor particles in the sealing resin; this reduces the occurrence of color unevenness in the light-emitting surface of the light-emitting device. Accordingly, the sealing resin of the light-emitting devices may further contain a filler having an average particle size of 1 to 100 μm and a nanoscale filler having an average particle size of 1 to 100 nm, in addition to the phosphor particles 81 and $TiO_2$ particles 82.

As the filler, a micron-sized particulate inorganic material may be used, such as silicon dioxide (silica), alumina, titania, zirconia or magnesia. As the nanofiller, a nano-sized particulate inorganic material may be used, such as silicon dioxide (silica), alumina, titania, zirconia or magnesia. The filler and nanofiller have different particle sizes by about three orders of magnitude, but may be the same material. It is preferred to use a material having heat resistance and easily adsorbing to the phosphor particles, as the nanofiller.

Figure 7:
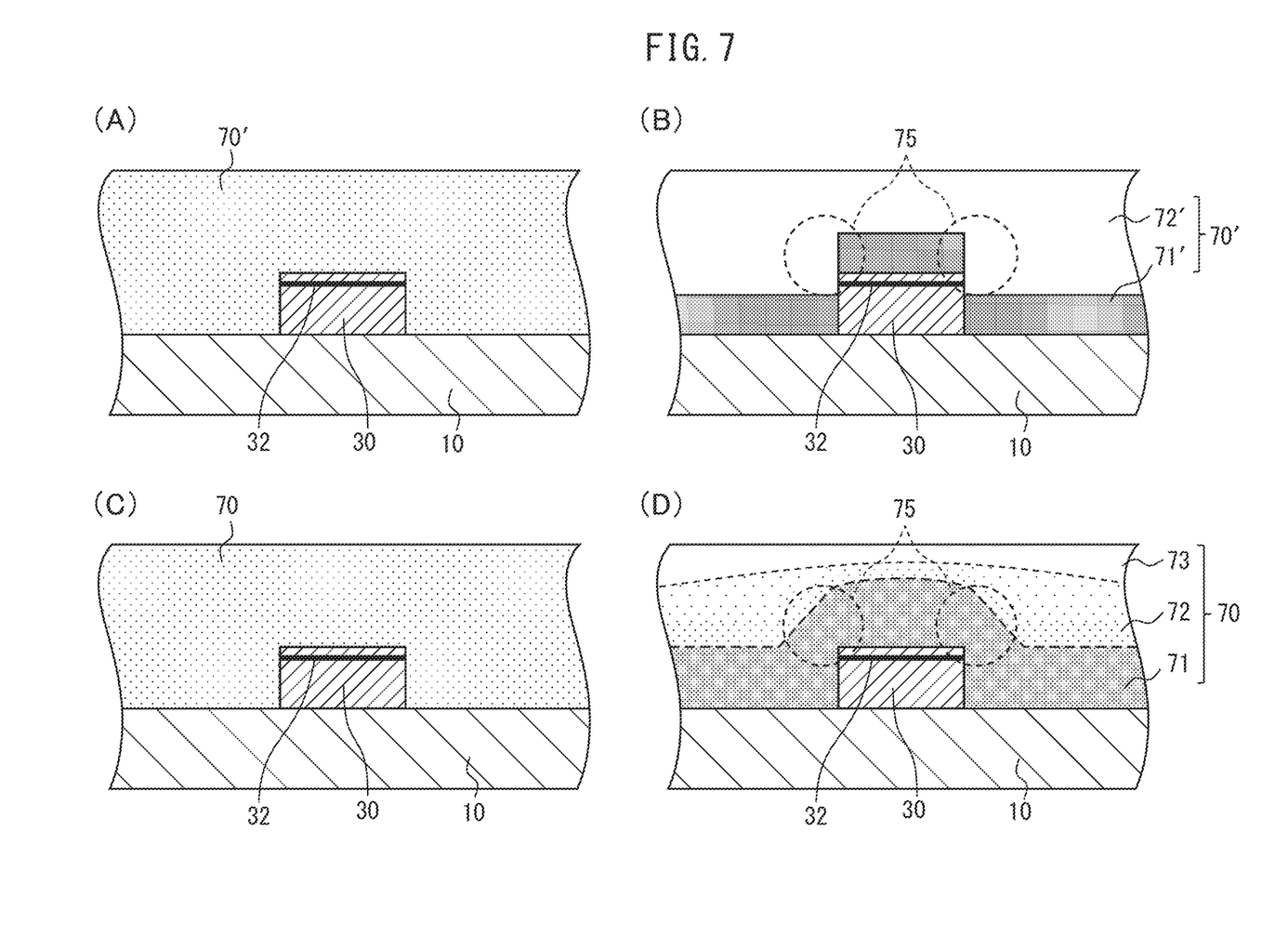
FIGS. 7(A) to 7(D) are enlarged cross-sectional views for explaining a deposition layer of the phosphor particles in the sealing resin.

FIGS. 7(A) to 7(D) are enlarged cross-sectional views for explaining a deposition layer of the phosphor particles in the sealing resin. These figures show an LED element 30 and its surrounding area in a light-emitting device similar to the light-emitting devices 1, 2 in enlarged form. FIG. 7(A) shows a cross section taken immediately after the LED element 30 is sealed in a sealing resin 70' not containing any nanofiller, while FIG. 7(B) shows a cross section taken after the phosphor particles are deposited in the sealing resin 70'. FIG. 7(C) shows a cross section taken immediately after the LED element 30 is sealed in a sealing resin 70 containing a nanofiller, while FIG. 7(D) shows a cross section taken after the phosphor particles are deposited in the sealing resin 70.

When the nanofiller does not exist, as shown in FIG. 7(B), a deposition layer 71' of the phosphor particles are formed in the sealing resin 70' on the upper surfaces of the mount board 10 and LED element 30, and the area above the deposition layer 71' is a resin layer 72' which does not substantially contain any phosphor particles. In this case, the deposition layer of the phosphor particles is not formed around (obliquely above) the upper surface of the LED element 30, as indicated by broken lines 75 in FIG. 7(B).

In contrast, when the nanofiller exists, as shown in FIG. 7(D), a deposition layer 71 of the phosphor particles, a dispersion layer 72 containing the phosphor particles so that its concentration increases toward the lower end thereof, and a resin layer 73 which does not substantially contain any phosphor particles are formed in the sealing resin 70 in this order from the side close to the mount board 10. The boundaries of the deposition layer 71, dispersion layer 72 and resin layer 73 may not be clearly defined in actuality, but are indicated by broken lines in FIG. 7(D) for convenience sake. In the sealing resin 70 of FIG. 7(D), since the phosphor particles are deposited so as to cover the upper and side surfaces of the LED element 30 and the area obliquely above the LED element 30, the deposition layer 71 of the phosphor particles is also formed around the upper surface of the LED element 30, as indicated by broken lines 75 in FIG. 7(D).

If a silicone resin and silicon dioxide are used as the sealing resin 70 and the filler and nanofiller, respectively, containing the nanofiller at a concentration (weight-percentage concentration) of about 0.4% to 0.5% in the sealing resin 70 will lead to the state shown in FIG. 7(D), after the sealing resin 70 is kept uncured for a considerable time period.

In the case of FIG. 7(B), since the phosphor particles are completely deposited, the deposition layer 71' does not exist around the light-emitting layer 32 of the LED element 30. However, in the case of FIG. 7(D), the lateral sides of the light-emitting layer 32 are covered by the deposition layer 71. The "semi-deposition state" is an intermediate state between dispersion and deposition of the phosphor particles in the sealing resin, and is a state wherein the light-emitting layer of each LED element is covered by the deposition layer of the phosphor particles. In the case of FIG. 7(D), light emitted obliquely above the LED element 30 is also subjected to the wavelength conversion by the phosphor particles in the deposition layer 71, similarly to light emitted in other directions. Accordingly, the emitted light is unlikely to have angle directivity in chromaticity, and thus color unevenness on the light-emitting surface of the light-emitting device is unlikely to occur. Further, in this case also, since the phosphor particles are disposed close to the mount board 10 as in the case of the complete deposition in FIG. 7(B), heat from the phosphor particles is easily discharged to the mount board 10, and thus overheating of the sealing resin 70 is also unlikely to occur.

Figure 8:
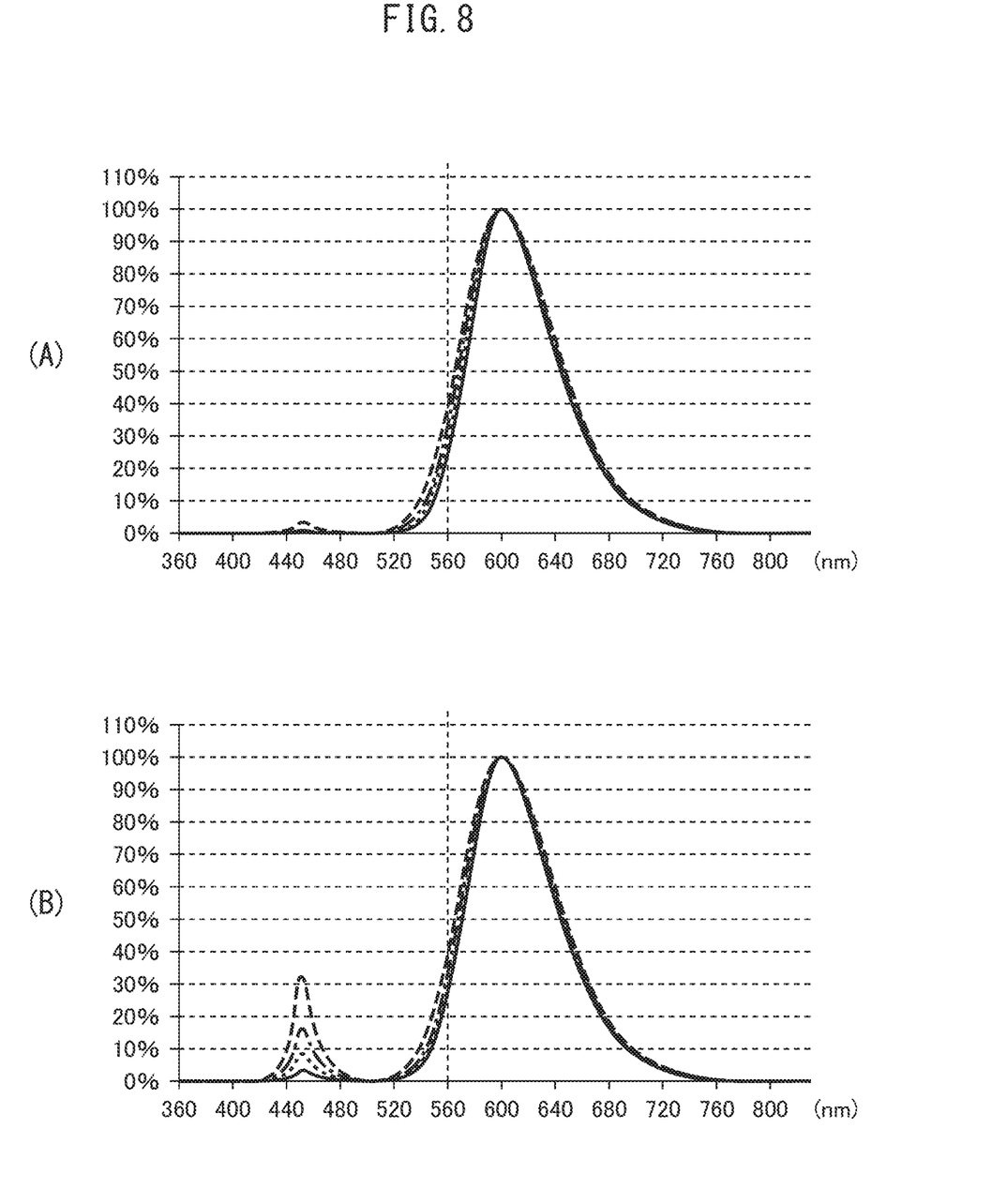
FIGS. 8(A) and 8(B) show a difference in emission spectrum depending on the degree of deposition of the phosphor particles.

FIGS. 8(A) and 8(B) show a difference in emission spectrum depending on the degree of deposition of the phosphor particles. Each figure shows results of measurement in which a silicone resin, a yellow phosphor and the same titanium-dioxide powders as the measurement of FIG. 6(A) are used as the sealing resin, phosphor particles and $TiO_2$ particles, respectively. The results in FIG. 8(A) are obtained by adding a nanofiller of silicon dioxide to the sealing resin at a concentration of about 0.5% and thereby realizing the semi-deposition state of the phosphor particles, while the results in FIG. 8(B) are obtained by completely depositing the phosphor particles without adding any nanofiller to the sealing resin. Each figure shows results of measurement obtained by changing the weight-percentage concentration of the $TiO_2$ particles in the sealing resin in a superposed manner. The abscissa and ordinate of each figure represent wavelength (nm) and relative intensity (%) with respect to the peak around 600 nm.

In the semi-deposition state of the phosphor particles, the $TiO_2$ particles 82 are also dispersed around the LED elements 30 at least in the deposition layer 71. Thus, the blue light emitted from the LED elements 30 is scattered or absorbed by the surrounding $TiO_2$ particles 82 and thereby attenuated, when it transmits through the sealing resin 50 and is emitted outside the device. In FIGS. 8(A) and 8(B), the emission intensities in the wavelength range of 600 nm or more are almost the same. However, in FIG. 8(A), the emission intensity in the wavelength range of 560 nm or less is more attenuated than in FIG. 8(B). Accordingly, the semi-deposition state of the phosphor particles allows for further attenuating short-wavelength light of 560 nm or less without substantially decreasing the emission intensity in the wavelength range of 600 nm or more.

The invention claimed is:
1. A light-emitting device comprising:
a mount board;
LED (light-emitting diode) elements mounted on the mount board and emitting a first light which is blue light or has a shorter wavelength than blue light; and
a sealing resin containing phosphor particles and titanium-dioxide particles and filled on the mount board to integrally seal the LED elements, the phosphor particles being excited by the first light to emit a second light, wherein
the first light and the second light are mixed and emitted as white light,
transmitting through the sealing resin causes the first light to be attenuated more than the second light by the titanium-dioxide particles; and
the sealing resin contains the titanium-dioxide particles at a concentration of 1% to 3%.
2. The light-emitting device according to claim 1, wherein an intensity ratio of light 560 nm or less in wavelength to all the emitted white light is less than 10%.
3. The light-emitting device according to claim 1, wherein the titanium-dioxide particles are dispersed in the sealing resin, and
the sealing resin contains the phosphor particles so that their concentration increases toward the mount board.
4. The light-emitting device according to claim 3, wherein the sealing resin further contains a filler having an average particle size of 1 to 100 μm and a nanoscale filler having an average particle size of 1 to 100 nm, and
the sealing resin includes a deposition layer of the phosphor particles through which the first light emitted from the LED elements transmits, the deposition layer covering upper and side surfaces of the LED elements and areas obliquely above the LED elements.
5. The light-emitting device according to claim 3, wherein the sealing resin includes a resin layer on a side further from the mount board, the resin layer containing the titanium-dioxide particles at a higher concentration than a side of the sealing resin closer to the mount board.
6. The light-emitting device according to claim 1, wherein the first light is blue light at a wavelength of 450 nm,
the second light is yellow light at a wavelength of 600 nm.

7. The light-emitting device according to claim 1, wherein the emitted white light does not attract sea turtles.

* * * * *